United States Patent [19]
Matsui

[11] Patent Number: 4,948,968
[45] Date of Patent: Aug. 14, 1990

[54] HIGH RESOLUTION OPTICAL ENCODER HAVING A LONG DETECTION STROKE

[75] Inventor: Keiji Matsui, Aichi, Japan

[73] Assignee: Spectra, Inc., Hanover, N.H.

[21] Appl. No.: 374,918

[22] Filed: Jul. 3, 1989

Related U.S. Application Data

[62] Division of Ser. No. 251,089, Sep. 29, 1988.

[30] Foreign Application Priority Data

Sep. 30, 1987 [JP] Japan ................... 62-246726
Sep. 30, 1987 [JP] Japan ................... 62-246727
Oct. 27, 1987 [JP] Japan ................... 62-271530

[51] Int. Cl.$^5$ ................... H01T 3/14; G01D 5/34; G01B 11/14
[52] U.S. Cl. .................... 250/237 G; 250/231.14; 250/231.18; 356/375
[58] Field of Search ................ 250/231 S, 237 G; 356/373, 374, 394; 33/706, 707; 341/13, 9, 3

[56] References Cited

U.S. PATENT DOCUMENTS

| | | | |
|---|---|---|---|
| 3,553,469 | 1/1971 | Stutz et al. | 250/237 G |
| 3,581,306 | 5/1971 | Johnson, Jr. | 341/13 |
| 3,806,913 | 4/1974 | Kerhoas et al. | 250/231 SE |
| 3,854,823 | 12/1974 | Loxham | 356/373 |
| 3,950,099 | 4/1976 | Malueg | 250/231 SE |
| 4,211,489 | 7/1980 | Kleinknecht et al. | 250/237 G |
| 4,253,021 | 2/1981 | Ernst | 250/237 G |
| 4,761,660 | 8/1988 | Lee | 250/237 G |

Primary Examiner—David C. Nelms
Assistant Examiner—Michael Messinger
Attorney, Agent, or Firm—Brumbaugh, Graves, Donohue & Raymond

[57] ABSTRACT

In order to detect positions, an optical encoder utilizes the phenomenon that the ratio in intensities of diffracted light beams of different orders change depending on the patterns of aperture ratios in one pitch of a grating on the scale, and that the distance between the positive and the negative diffracted light beam of the same order vary depending on the patterns of the grating pitch on the scale, or that the light spots of the positive and the negative diffracted light beams of the same order move (rotate) depending on the patterns of the grating line direction. Therefore, this optical encoder is free from the adverse influence of fluctuations in the amount of coherent light illuminated from the light source to thereby enable precise positional detection.

15 Claims, 18 Drawing Sheets

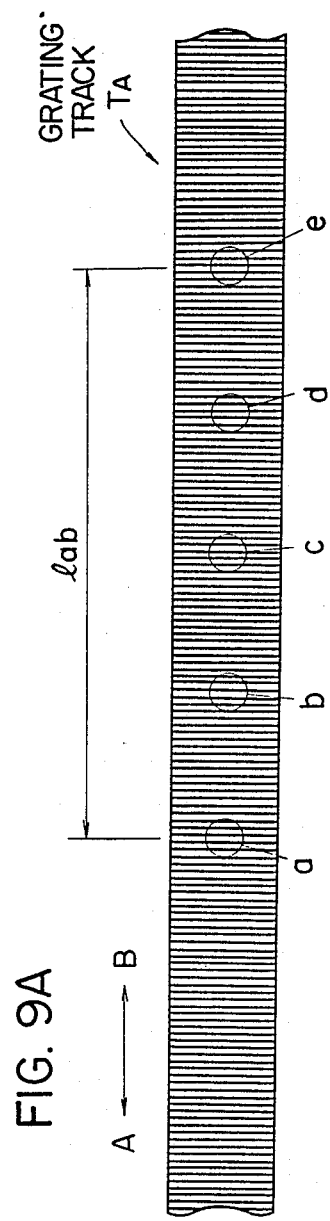
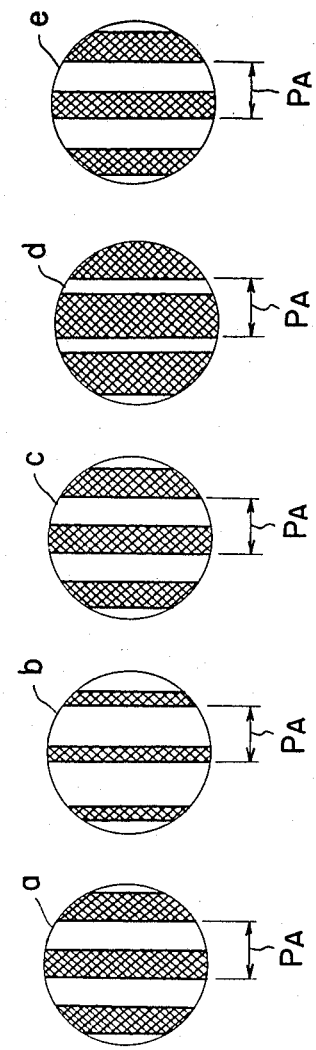

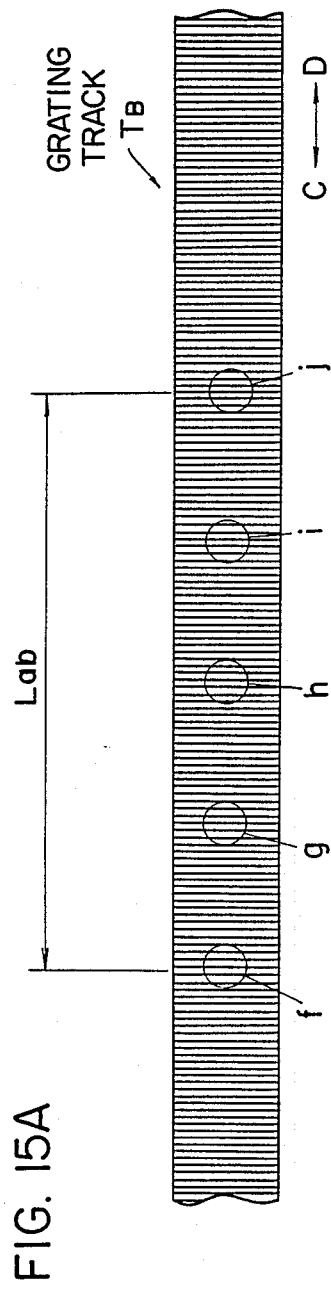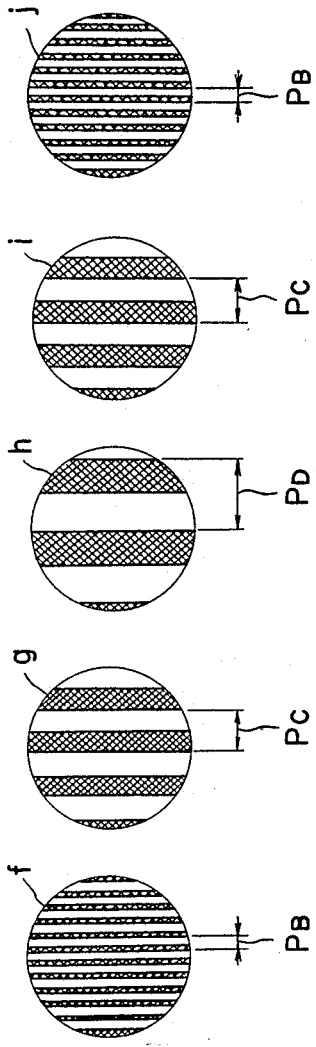

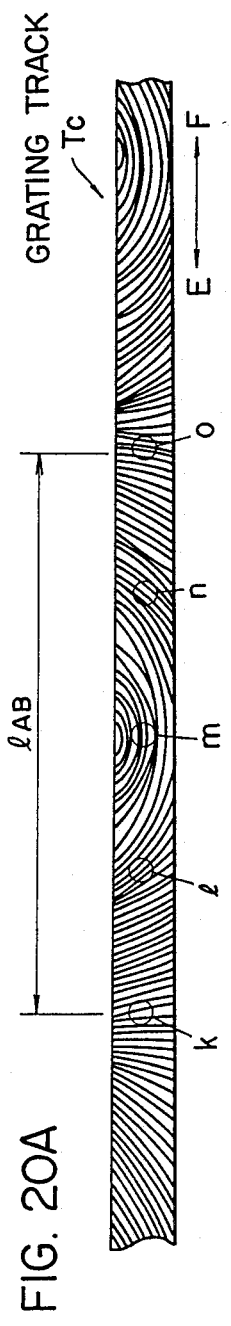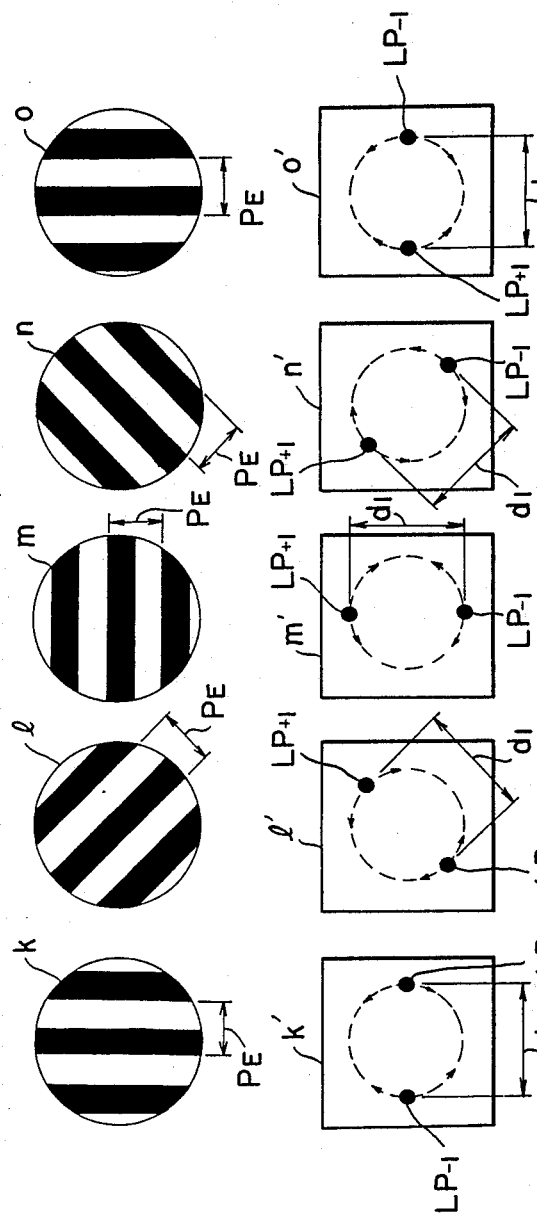

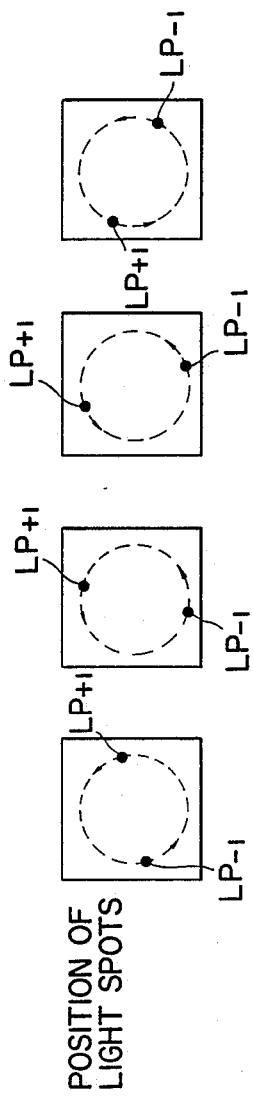
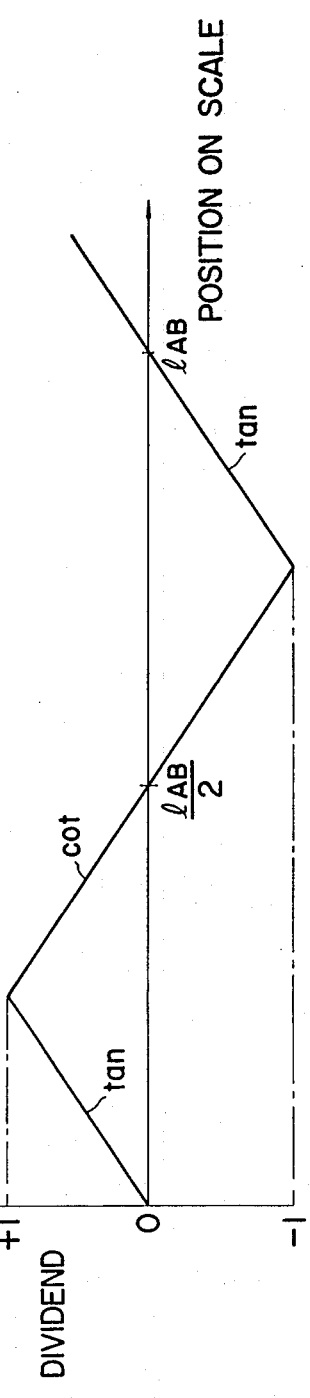

HIGH RESOLUTION OPTICAL ENCODER HAVING A LONG DETECTION STROKE

This application is a divisional of application Ser. No. 251,089, filed Sept. 29, 1988.

BACKGROUND OF THE INVENTION

This invention relates to an optical encoder which is applicable to positional measurement for machine tools such as lathes, milling machines or the like or semiconductor manufacturing systems.

FIG. 1 is a perspective structural view to showing an example of an optical system in a prior art absolute type optical encoder which comprises a luminous element 11 such as a LED (light emitting diode), a lamp or the like which emits light La for measurement, a collimating lens 12 which collimates the light La emitted from the luminous element 11 into parallel light Lb, a first scale 13 which has N (N is an integer) grating tracks $t_1, t_2, \ldots, t_n$ arranged on the surface in parallel, each grating track comprising sections 13A (referred to as transmission sections herein) which allow the parallel light Lb which has passed through the collimating lens 12 to pass and sections 13B (referred to as non-transmission sections herein) which does not allow the parallel light Lb to transmit therethrough alternating in a predetermined length (referred to as a grating pitch herein), a second scale 14 which is provided with transmission windows $14A_1, 14A_2, \ldots, 14A_n$ which allow light beams (not shown) passing through the transmission sections 13A to pass and are arranged in correspondence to the respective grating tracks $t_1, t_2, \ldots, t_n$ of the first scale 13, and photo detectors 15-1, 15-2, ..., 15-n which are arranged in correspondence to the respective transmission windows $14A_1, 14A_2, \ldots, 14A_n$ so as to convert light beams $L_{c1}, L_{c2} \ldots, L_{cn}$ passed through the respective transmission windows $14A_1, 14A_2, \ldots, 14A_n$ into electric signals according to their intensities,.

The first scale 13 used in the optical system 10 in the prior art absolute type optical encoder is provided with reflected binary codes (Gray codes) as shown in FIG. 2 wherein grating pitches $P_1, P_2, P_3, \ldots, P_{n-1}, P_n$ between the adjacent grating tracks $t_1$ and $t_2$; $t_2$ and $t_3$; ... ; $t_{n-1}$ and $t_n$ are in a ratio of 1:2. Accordingly, the intensities of the light beams $L_{c1}, L_{c2}, L_{c3}, \ldots, L_{cn-1}, L_{cn}$ which have transmitted through the transmission sections 13A of the respective grating tracks $t_1, t_2, t_3, \ldots, t_{n-1}, t_n$ of the first scale 13 and the transmission windows $14A_1, 14A_2, 14A_3, \ldots, 14A_{n-1}, 14A_n$ of the second scale 14 corresponding to the grating tracks $t_1, t_2, t_3, \ldots, t_{n-1}, t_n$ of the first scale 13 and entered the respective photo detectors 15-1, 15-2, 15-3, ..., 15-n-1, 15-n corresponding to the transmission windows $14A_1, 14A_2, 14A_3, \ldots, 14A_{n-1}, 14A_n$ periodically change since the first scale 13 moves in a longitudinal direction (the direction marked by an arrow m). Responsive to the changes, the electric signals converted by the respective photo detectors 15-1, 15-2, 15-3, ..., 15-n-1, 15-n change periodically. FIG. 3 shows such periodical changes of the electric signals $S_1, S_2, S_3, \ldots, S_{n-1}, S_n$ in a graph wherein a displacement ml of the first scale 13 in the longitudinal direction is plotted on a horizontal axis while the electric signals $S_1, S_2, S_3, \ldots, S_{n-1}, S_n$ converted by the respective photo detectors 15-1, 15-2, 15-3, ..., 15-n-1, 15-n are plotted on a vertical axis. FIG. 4 is a block diagram of an absolute type optical encoder wherein the electric signals $S_1, S_2, S_3, \ldots, S_{n-1}, S_n$ are digitized by respective comparators 20 into digital signals $d_1, d_2, d_3, \ldots, d_{n-1}, d_n$ and further converted form the reflected binary codes into an absolute positional data D of desired form such as simple binary codes or a BCD code by a decoder 30.

There are demands to improve a resolutional detection of a conventional absolute type optical encoder so as to enable detection of minute displacements, and to enable detection of absolute positions of a longer stroke. However, the conventional absolute type optical encoder is defective in that its resolutional detection is limited in such a way that the detection of smaller positions than the grating pitch $P_n$ in the track $t_n$, which is segmented into the smallest possible segments, is impossible, and the detection stroke in its absolute positional detection remains at a level similar to the grating pitch $P_1$ of the track $t_1$ which is segmented into the largest possible segments. If an attempt is made to improve its resolutional detection and to extend the detection stroke, the number of grating tracks inevitably increases to enlarge the size of the absolute type optical encoder, or to inconveniently increase the number of components such as photo detectors and comparators.

SUMMARY OF THE INVENTION

An object of this invention is to provide an optical encoder of a compact size which has higher resolution in positional detection and has a longer detection stroke in absolute positional detection as compared to prior art encoders.

According to one aspect of this invention, for achieving the objects described above, there is provided an optical encoder comprising a light source unit which emits coherent parallel light, a scale which is provided with a grating track of the same pitch but of a different ratio between non-transmission sections and transmission sections and which diffracts said coherent parallel light emitted from said light source unit, and a photo detecting unit which receives plural diffracted light beams of different orders out of light beams diffracted by said scale and converts said plural diffracted light beams of different orders into electric signals in accordance with the intensities thereof.

According to another aspect of this invention, there is provided an optical encoder comprising a light source unit which emits coherent parallel light, a scale which is provided with a grating track of the same ratio but of different pitches between non-transmission sections and transmission sections and which diffracts said coherent parallel light emitted from said light source unit, and a light spot position detecting unit which receives positive and negative diffracted light beams of the same order out of light beams diffracted by said scale, detects light spot positions of said respective positive and negative diffracted light beams of the same order and converts said light spot positions into electric signals.

Further, according to still another aspect of this invention, there is provided an optical encoder comprising a light source unit which emits coherent parallel light, a scale which is provided with a grating track of the same ratio and pitch between non-transmission sections and transmission sections and which diffracts said coherent parallel light emitted from said light source unit, and a light spot position detecting unit which receives positive and negative diffracted light beams of the same order out of light beams diffracted by said scale, detects light spot positions of said respective positive and negative diffracted light beams of the same order and converts said light spot positions into electric signals.

The nature, principle and utility of the invention will become more apparent from the following detailed description when read in conjunction with the accompanying drawings.

BRIEF DESCRIPTION OF THE DRAWINGS

In the accompanying drawings:

FIGS. 9A, 9B, 9C, 9D, 9E, and 9F are views showing an embodiment of a grating track thereof;

FIGS. 15A, 15B, 15C, 15D, 15E, and 15F are views showing an embodiment of a grating track thereof;

FIGS. 20A, 20B, 20C, 20D, 20E, 20F, 20G, 20H, 20I, 20J, and 20K are views showing an embodiment of a grating track thereof;

FIGS. 22 and 23A, 23B, 23C, 23D, 23E, and 23F are explanatory views to illustrate detecting methods respectively.

DESCRIPTION OF THE PREFERRED EMBODIMENTS

The first embodiment in accordance with the present invention is described below.

Figure 1:
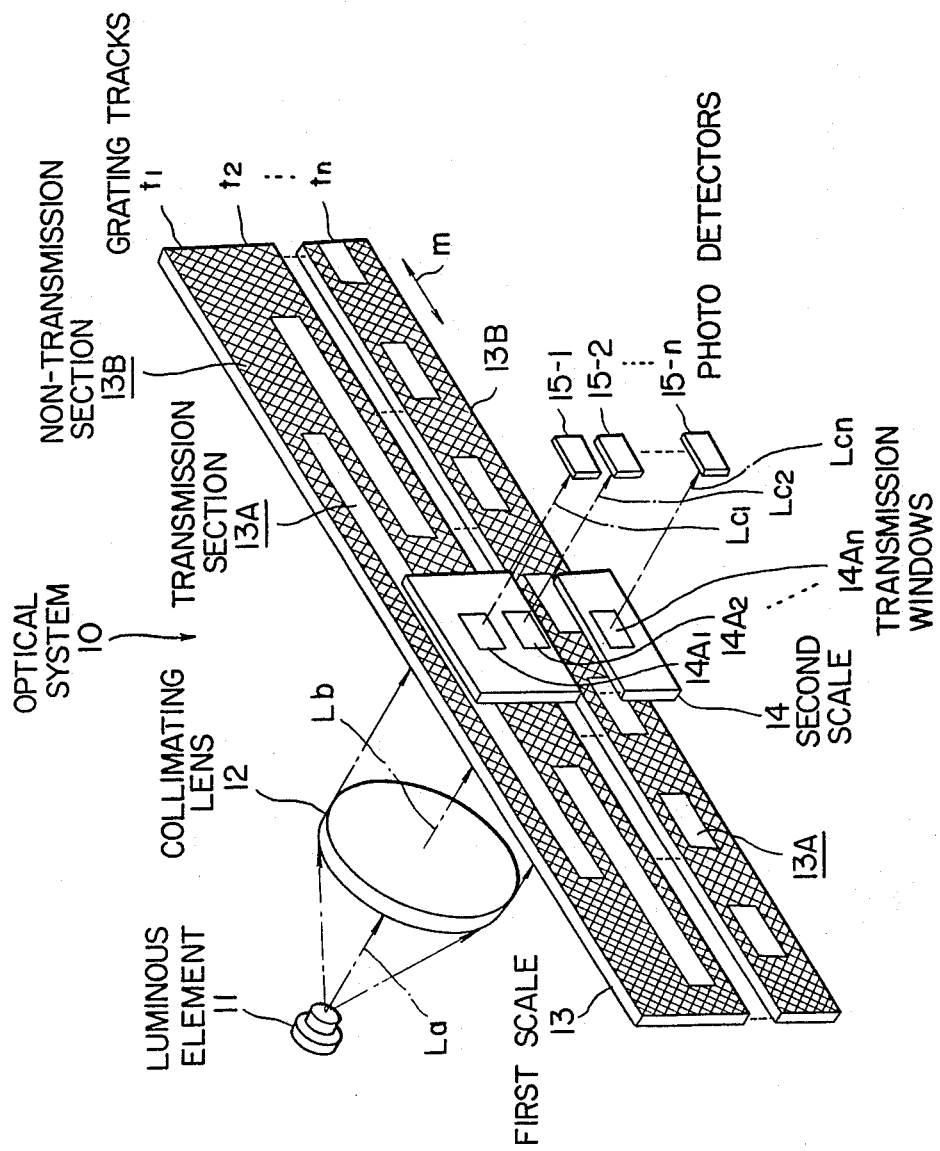
FIG. 1 is a perspective structural view showing an example of an optical system of a conventional optical encoder.
Figure 2:
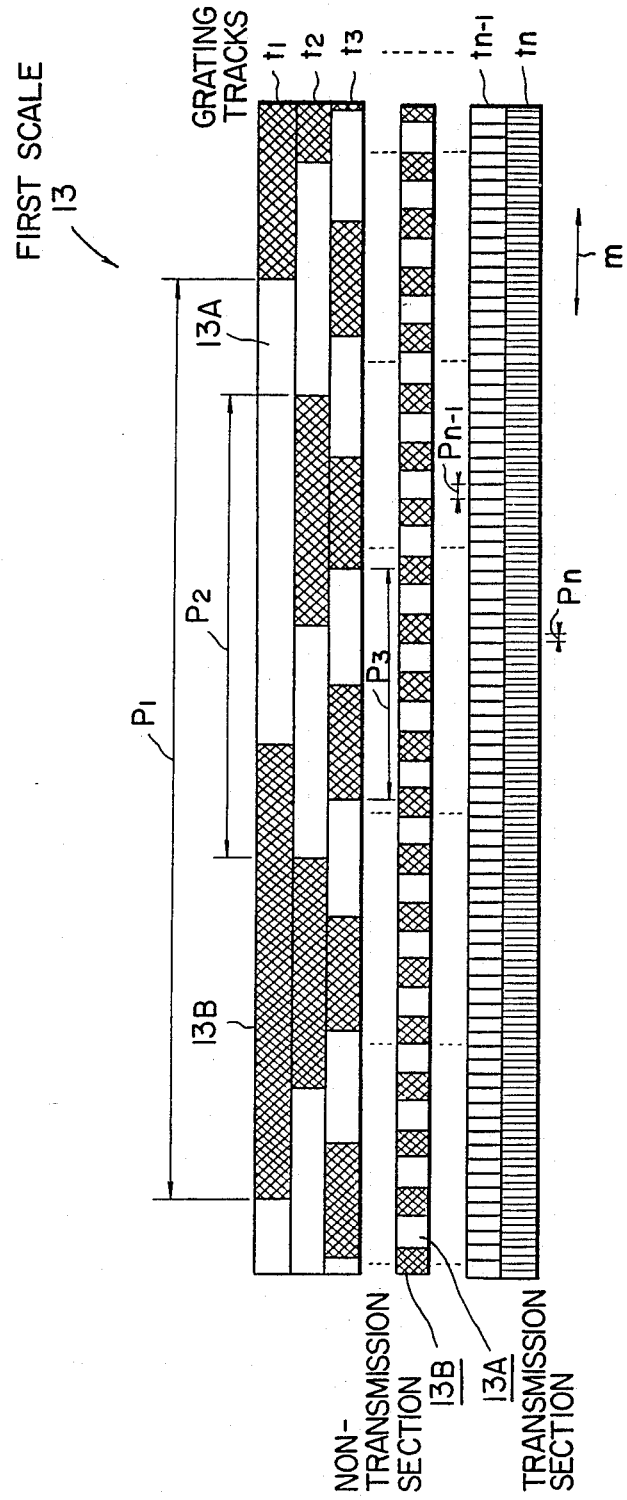
FIG. 2 is a view showing an example of a grating track thereof.
Figure 3:
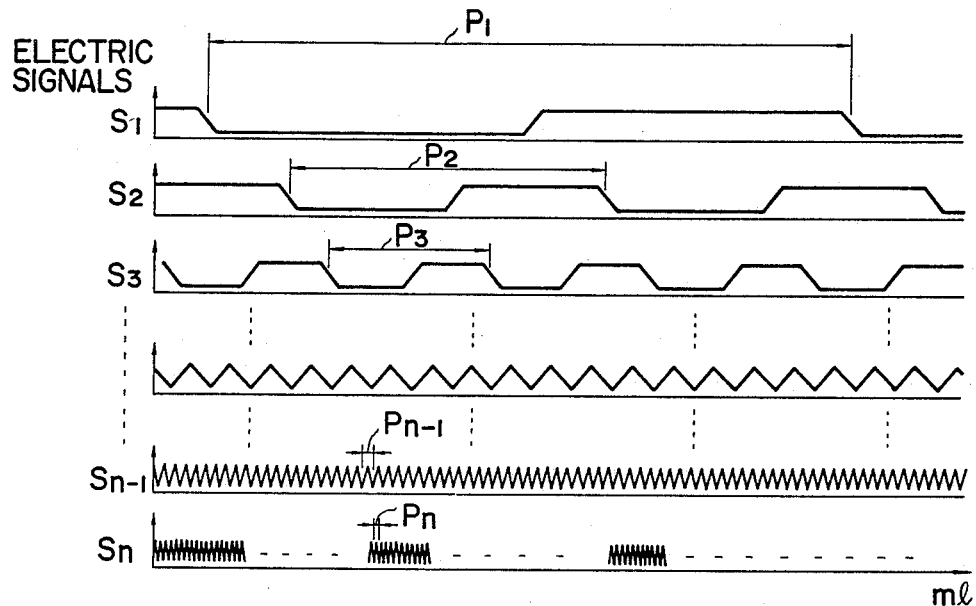
FIG. 3 is a graph showing an example of electric signals thereof.
Figure 4:
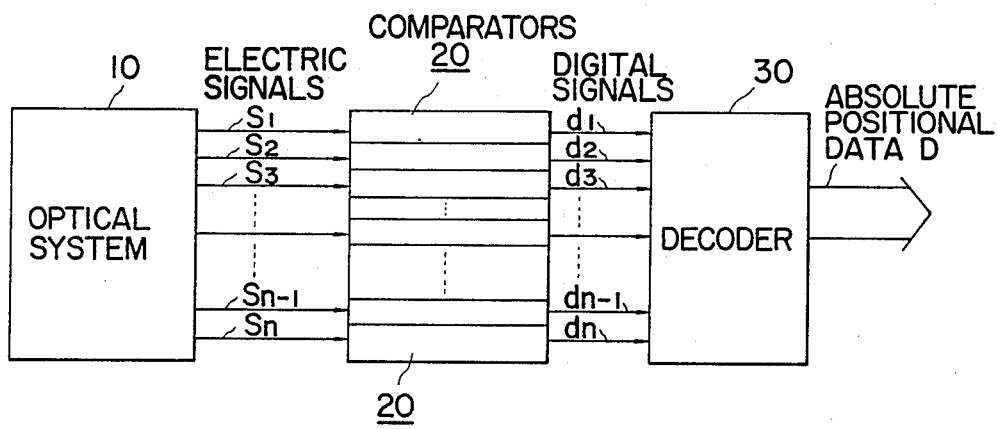
FIG. 4 is a block diagram showing an example of a detection circuit thereof.
Figure 5:
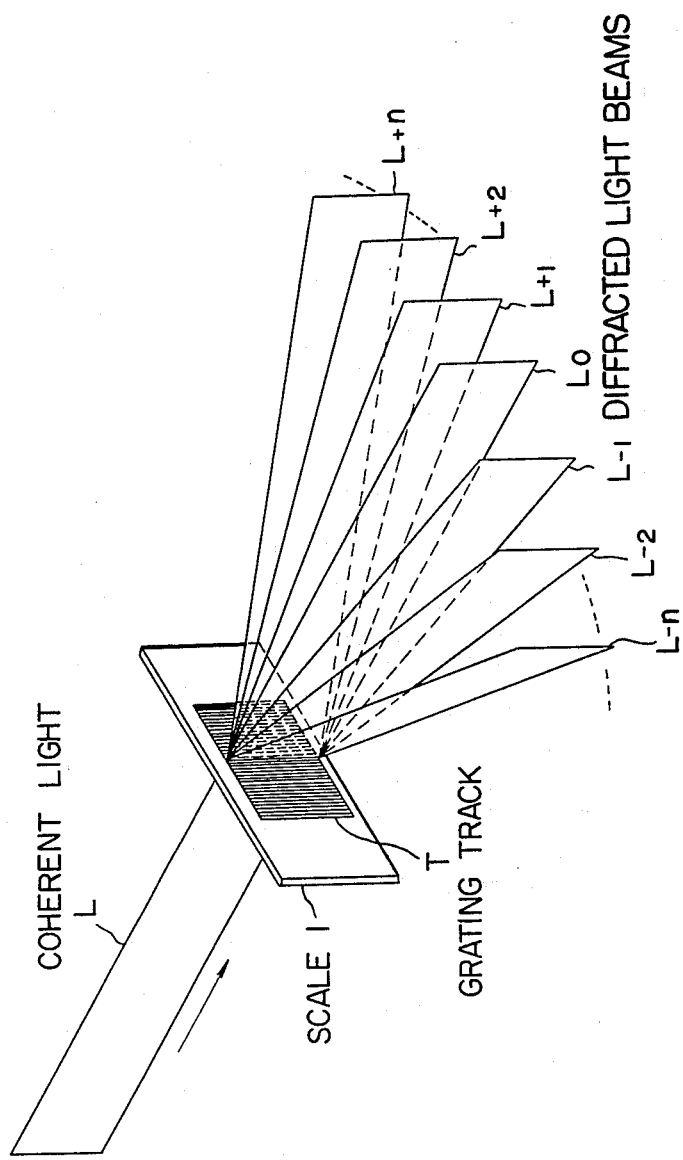
FIGS. 5 through 7 are views used to describe a first embodiment in accordance with the present invention.
Figure 6:
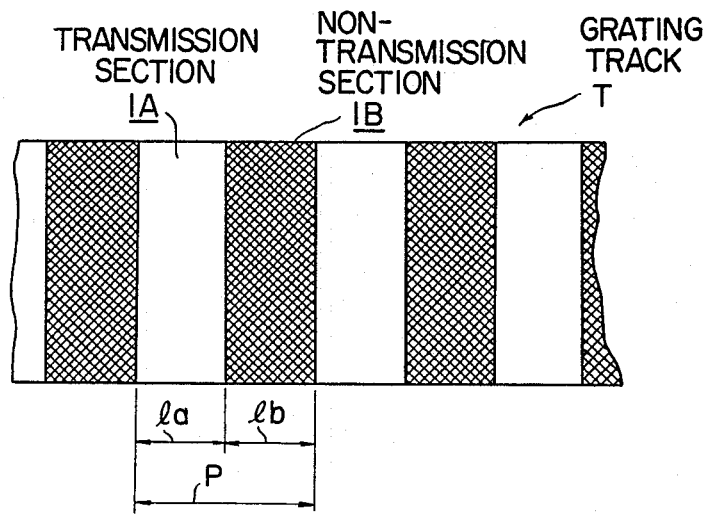

As shown in FIG. 5, when coherent light L such as a laser beam is entered in a scale 1 on which surface is provided a grating track T having transmission sections and non-transmission sections alternating at a predetermined pitch, the coherent light L which has passed through the transmission sections is diffracted into plural diffracted light beams $L_o$, $L\pm_1$, $L\pm_2$, ..., $L\pm_n$ (hereinafter referred to as nth-order diffracted light beams (n is an integer)). FIG. 6 shows the aforementioned grating track T. A ratio Q (hereinafter referred to as an aperture ratio) of the transmission section 1A in a grating pitch can be represented by a following expression (1) if a length of the transmission section 1A is denoted as L a, and the length of the non-transmission section 1B is denoted as lb, and the pitch of the grating is denoted as P.

$$Q = \frac{la}{P} \quad (1)$$

A ratio I in intensity between the nth-order diffracted light beam $L\pm_n$ and the 0th-order diffracted light beam $L_o$ is represented by a following expression (2).

$$I = \frac{\sin^2(n\pi Q)}{(n\pi Q)^2} \quad (2)$$

Figure 7:
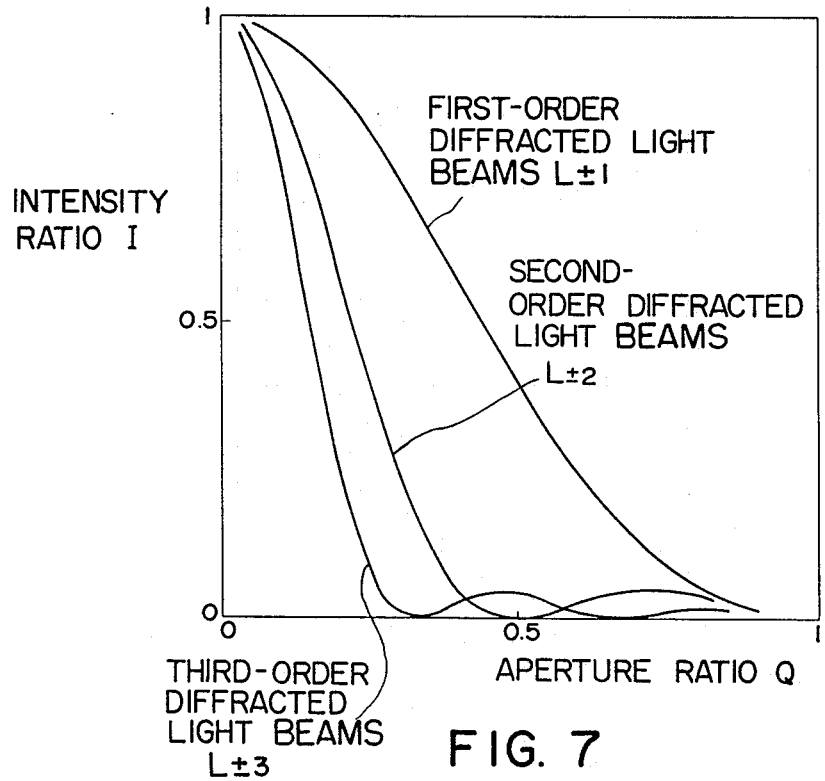

FIG. 7 is a graph to show the relationship between the aperture ratio Q and the respective intensity ratios I of the first-order diffracted light beams $L\pm_1$, the second-order diffracted light beams $L\pm_2$, and the third-order diffracted light beams $L\pm_3$. As is obvious from the graph, the intensity ratio I varies between the diffracted light beams $L\pm_1$, $L\pm_2$, $L\pm_3$ since the aperture ratio Q varies. Positions on the scale can therefore be detected by detecting the intensity ratio I of two arbitrary diffracted light beams of different orders which can be obtained by entering the coherent light L into the scale having a grating track of various aperture ratios Q on the surface thereof.

The first embodiment of this invention will now be described.

Figure 8:
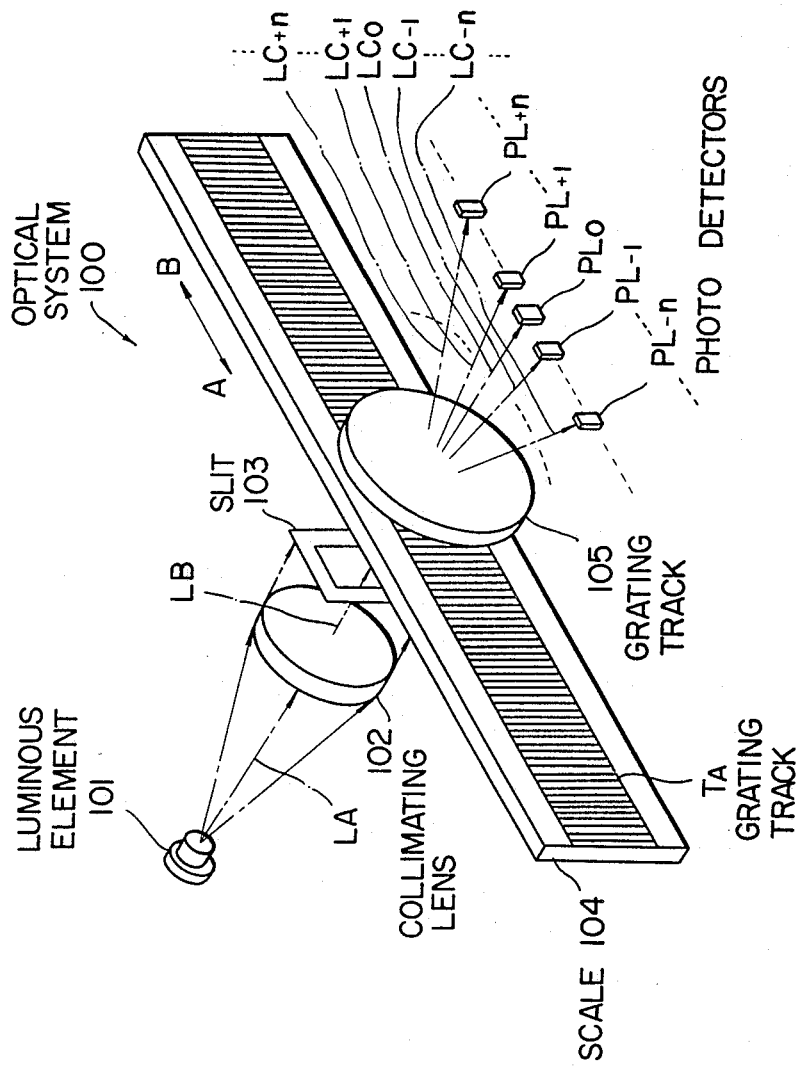
FIG. 8 is a perspective structural view showing an embodiment of an optical system thereof.

FIG. 8 is a perspective structural view to show an embodiment of an optical system of an optical absolute encoder according to this invention which comprises a luminous element 101 such as an LD (laser diode) which emits coherent light LA, a collimating lens 102 which collimates the coherent light LA into parallel light LB, a slit 103 which allows the parallel light LB to partially pass therethrough to become a flux of light of a predetermined width (not shown), an elongated scale 104 having on the surface thereof a grating track $T_A$ where sections which transmit the light flux and non-transmission sections are alternated at a predetermined pitch, a focusing lens 105 which focuses plural diffracted light beams (not shown) after diffraction by the grating track $T_A$, and photo detectors $PL_o$, $PL\pm_1$, ..., $PL\pm_n$ which are arranged in correspondence to respective diffracted light beams $LC_o$, $LC\pm_1$, ..., $LC\pm_n$ from the focusing lens 105 and which convert the respective diffracted light beams $LC_o$, $LC\pm_1$, ..., $LC\pm_n$ into electric signals according to their intensities. The luminous element 101, the collimating lens 102, the slit 103 and the focusing lens 105 are fixed in a linear arrangement and may be moved relative to the scale 104. In the figure, however, the scale 104 is adapted to move linearly in the longitudinal direction A or B.

The scale 104 used in the optical system 100 of the absolute type optical encoder of the above structure is provided with the grating track $T_A$ where the grating pitch Pa (several μm to several tens μm) is constant over an entire length of the scale 104, but the aperture ratio Q smoothly varies in a distance $l_{ab}$ as shown in FIGS. 9A–F (e.g. the aperture ratios are 0.5 at a point a, 0.75 at a point b, 0.5 at a point c, 0.25 at a point d and 0.5 at a point e). The intensities of the diffracted light beams $LC_o$, $LC\pm_1$, ..., $LC\pm_n$ which enter into the photo detectors $PL_o$, $PL\pm_1$, ..., $PL\pm_n$ periodically change since the aperture ratio Q changes when the scale 104 moves in the longitudinal direction A or B. Responsive to such changes, the respective electric signals converted at the photo detectors $PL_o$, $PL\pm_1$, ..., $PL\pm_n$ periodically change.

As described above, because the aperture ratio is used simply to obtain the intensity ratio of diffracted light, the aperture ratio in the distance $l_{ab}$ may be changed arbitrarily so that the electric signals which increase at a certain rate since the scale 104 moves or change into sine waves or triangle waves can be obtained easily. By using the intensity ratio of two arbitrary diffracted light beams of different orders or the ratio of electric signals, the position on the scale can be simply detected.

Figure 10:
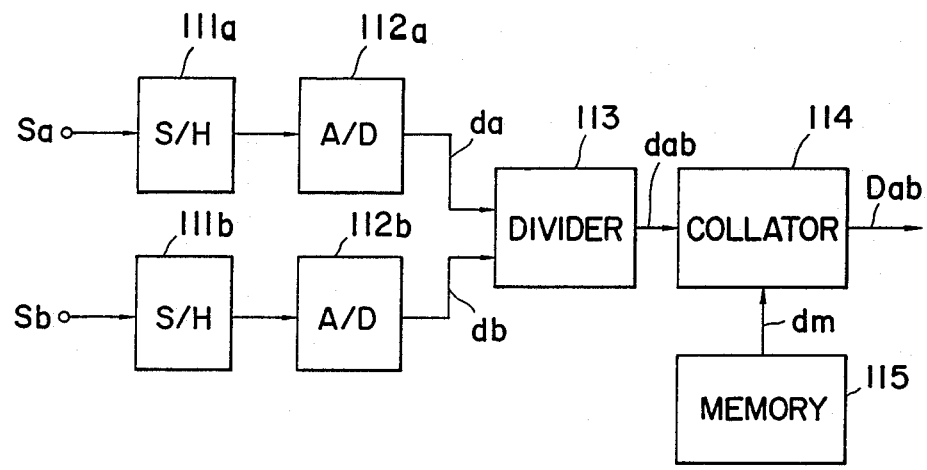
FIG. 10 is a block diagram showing an embodiment of a detection circuit thereof.

FIG. 10 is a block diagram to show an embodiment of a reader which obtains a positional data out of the electric signals from the aforementioned photo detectors. In a manner mentioned above, two arbitrary diffracted light beams of different orders are selected. For instance, electric signals Sa and Sb from the photo detectors $PL_o$ and $PL_{+1}$ which convert the 0th-order diffracted light beam $LC_o$ and the first-order diffracted light beam $LC_{+1}$ into electric signals are digitized by sample-and-hold circuits 111a and 111b and A/D converters 112a and 112b into digital data units $d_a$ and $d_b$. The digital data units $d_a$ and $d_b$ are divided by a divider 113 to become digital data $d_{ab}$ which expresses a ratio and outputted to a collator 114. A memory 115 stores in advance the ratios of the electric signals which represent respectively the intensities of the two diffracted light beams $LC_o$ and $LC_{+1}$ of different orders corresponding to the grating track patterns, and the positional data corresponding to the ratios. The ratio dm of the electric signals read out of the memory 115 is referred to the ratio $d_{ab}$ of the electric signals obtained by the divider 113 so as to output an appropriate positional data $D_{ab}$ on the scale.

Figure 11:
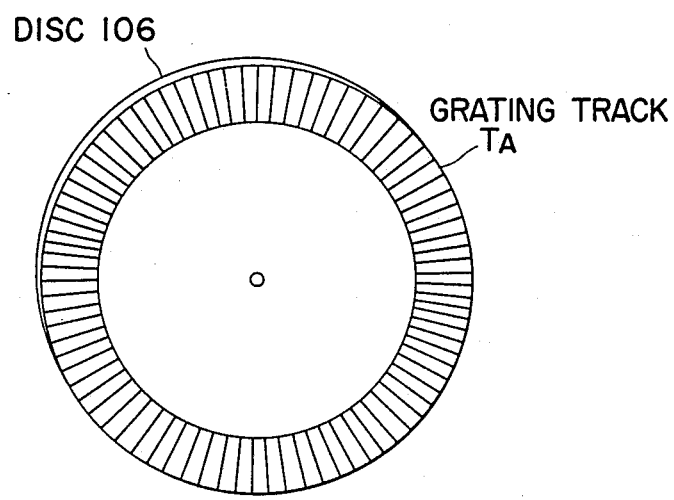
FIG. 11 is a perspective view showing another application of a grating track.

Although in the aforementioned first embodiment, the coherent light emitted from the luminous element is transmitted into the scale to obtain the diffracted light beams, it may be reflected from the scale to obtain the diffracted light beams because transmitted light and reflected light have the same properties. When the light is reflected, the luminous element, the collimating lens, the slit, the focusing lens and the photo detectors are arranged on the same side as the scale, and the scale comprises sections which reflect light and sections which do not reflect light. If the scale is made into a disc 106 as shown in FIG. 11, and the grating track $T_A$ is arranged annularly on the surface thereof and the disc 106 may be rotated around the center thereof, the angles can be detected in absolute fashion. Although in the aforementioned embodiment, the light source and the photo detectors are fixed while the scale is moved for a positional detection, the scale may be fixed while the light source and the photo detectors are moved to achieve a similar effect in a positional detection.

In the first embodiment, the grating track has different ratios of the non-transmission sections and the transmission sections, but has the same pitch and grating line direction over the whole length. The positions are detected by the intensity ratios of the plural diffracted light beams having different orders. The same effect can be achieved in positional detection by the second embodiment which will be described below.

Figure 12:
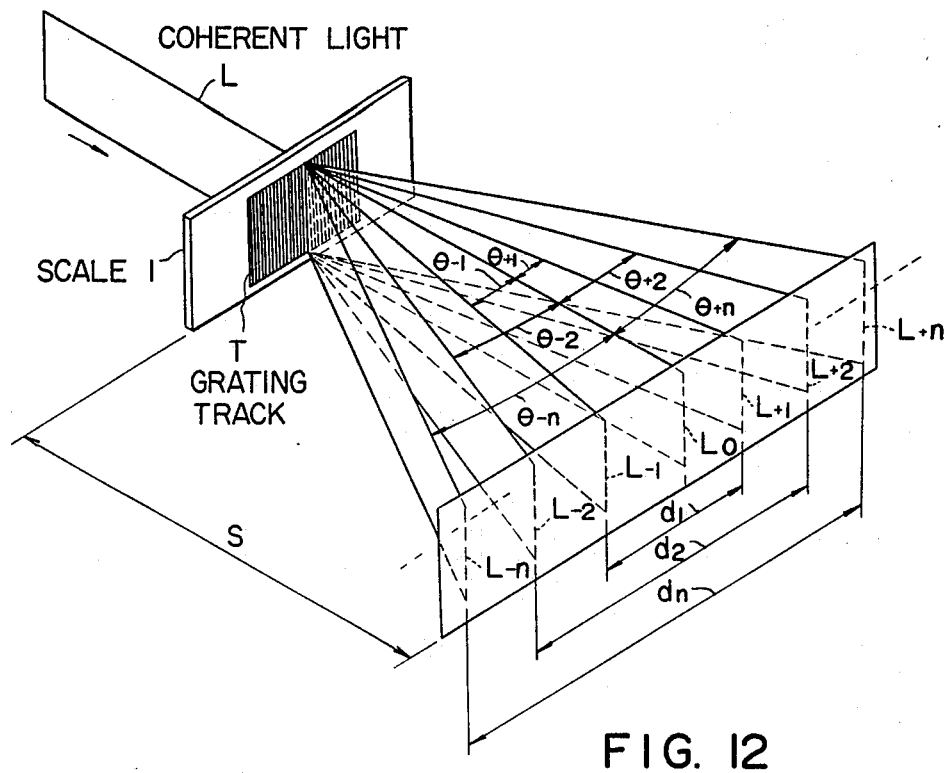
FIGS. 12 and 13 are views used to explain a second embodiment in accordance with the present invention.

As shown in FIG 12, when coherent light L such as a laser beam is entered into a scale 1 on which surface is provided a grating track T having transmission sections and non-transmission sections alternating at a predetermined pitch, the coherent light L which has passed through the transmission sections is diffracted into plural diffracted light beams $L_o$, $L\pm_1$, $L\pm_2$, ..., $L\pm_n$ (hereinafter referred to as nth-order diffracted light beams (n is an integer). Angles $\pm\theta_n$ (referred to as the diffraction angles) formed by the positive and negative nth-order diffracted light beams $L\pm_n$, $L_{-n}$ and the coherent light L can be expressed by a following expression (3) using a wavelength $\lambda$ of the coherent light L and a pitch P of the grating track T.

$$\pm\theta_n = \pm\sin^{-1}\left(\frac{n\lambda}{P}\right) \quad (3)$$

A distance $d_n$ between the positive and negative diffracted light beams $L+_n$ and $L-_n$ projected on a screen which is placed apart from the scale 1 by a distance S is represented by a following expression (4).

$$d_n = 2S\tan\left\{\sin^{-1}\left(\frac{n\lambda}{P}\right)\right\} \quad (4)$$

Figure 13:
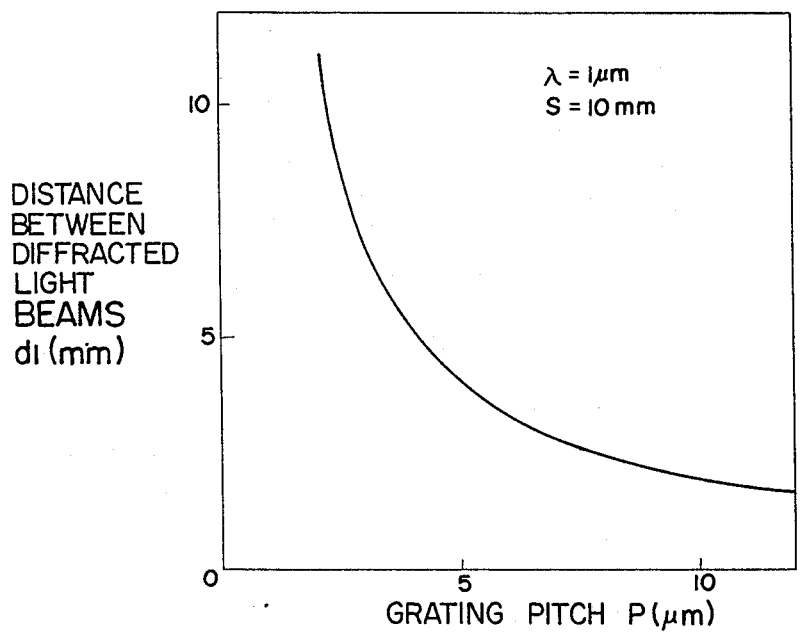

FIG. 13 is a graph to show the relationship of the distance $d_1$ between the positive and negative first-order diffracted light beams $L+_1$, $L-_1$, and the grating pitch P when the wavelength $\lambda$ of the coherent light L is set at 1 $\mu$m and the distance S between the scale 1 and the screen 2 is set at 10 mm. As is obvious from the graph, as the grating pitch P varies, the distance $d_1$ varies. If the coherent light L is entered into a scale having a grating track with different pitches P depending on the locations to obtain selected positive and negative diffracted light beams $L+_n$, $L-_n$ of the same order, then positional detection on the scale can be conducted by using the distance $d_n$ between the above two diffracted light beams.

The second embodiment of this invention will now be described.

Figure 14:
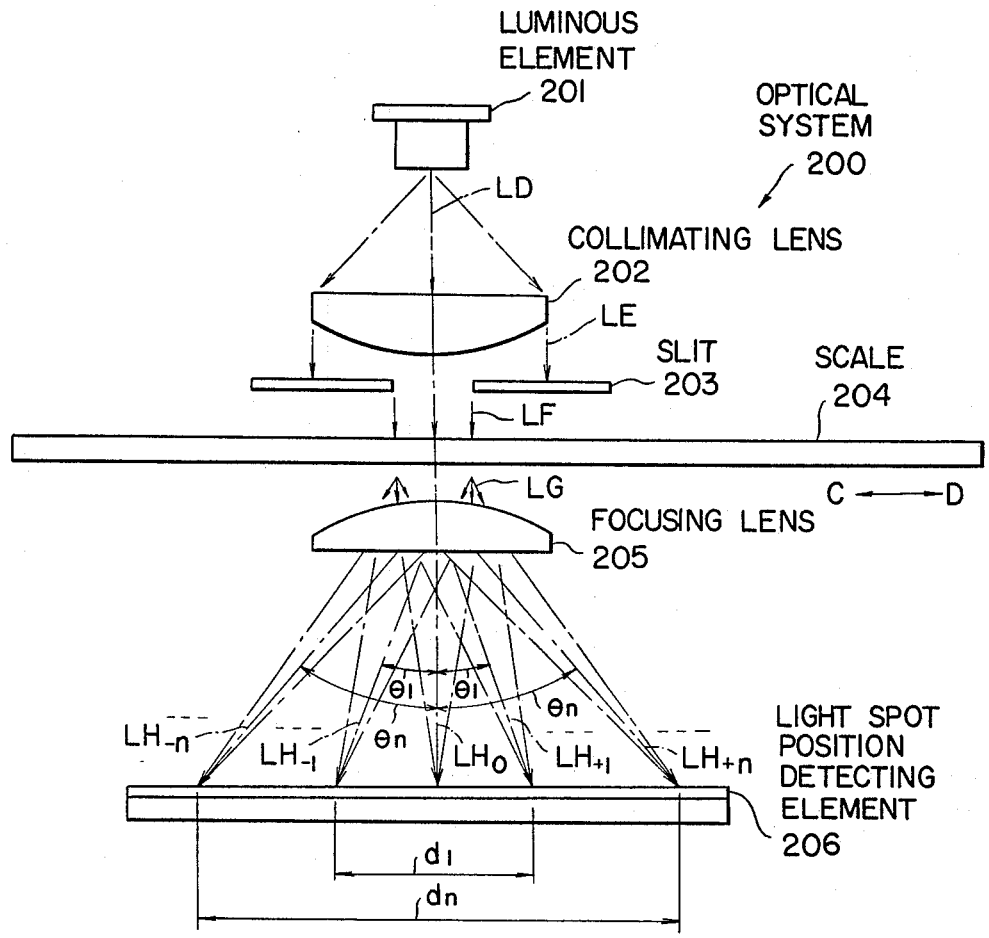
FIG. 14 is a structural view showing an embodiment of an optical system thereof.

FIG. 14 is a structural view to show an embodiment of an optical system of an optical absolute encoder according to this invention which comprises a luminous element 201 such as a LD (laser diode) which emits coherent light LD, a collimating lens 202 which collimates the coherent light LD into parallel light LE, a slit 203 which allows the parallel light LE to partially pass therethrough to become a flux LF of light of a predetermined width, an elongated scale 204 having on the surface thereof a grating track $T_B$ where sections which transmit the light flux LF and non-transmission sections are alternated at the same ratio but in different pitches, a focusing lens 205 which focuses plural diffracted lights LG after diffraction by the grating track $T_B$, and a light spot position detecting element 206 such as an image sensor which detects positions of light spots of respective diffracted light beams $LH_o$, $LH\pm_1$, ..., $LH\pm_n$ from the focusing lens 205 and converts the positions of the light spots into electric signals. The luminous element 201, the collimating lens 202, the slit 203 and the focusing lens 205 are fixed in linear arrangement and may be moved relatively to the scale 204. In the figure, however, the scale 204 is adapted to move linearly in the longitudinal direction C or D.

The scale 204 used in the optical system 200 of the absolute type optical encoder of the above structure is provided with the grating track $T_B$ where the grating pitches which smoothly and gradually change during a distance $L_{ab}$ as shown in FIGS. 15A-F (e.g. the grating pitches are $P_b$ at a point f, $P_c$ at a point g, $P_d$ at a pint h, $P_c$ at a point i and $P_b$ at a point j). The diffraction angles of the respective diffracted light beams $LH\pm_1, \ldots, LH\pm_n$ incident on the light spot position detecting element 206 periodically changes respectively since the scale 204 moves longitudinally to vary the grating pitches. The light spot positions of the respective diffracted light beams $LH\pm_1, \ldots, LH\pm_n$ focusing on the light spot position detecting element 206 change responsive to the above periodical changes. More particularly, the smaller the grating pitch, the larger becomes the diffraction angle to widen the distance between the positive and negative diffracted light beams of the same order. Conversely, the larger the grating pitch, the smaller becomes the diffraction angle to narrow the distance between the positive and negative diffracted light beams of the same order.

As described in the above statement, the grating pitch is used simply to vary the diffraction angle, and therefore it is possible to change the grating pitches in the distance $L_{ab}$ arbitrarily so as to easily obtain the electric signals which increase at a certain rate since the scale 204 moves or which change into sine waves or triangle waves. The position on the scale can therefore be detected from the distance between arbitrarily chosen positive and negative diffracted light beams of the same order.

Figure 16:
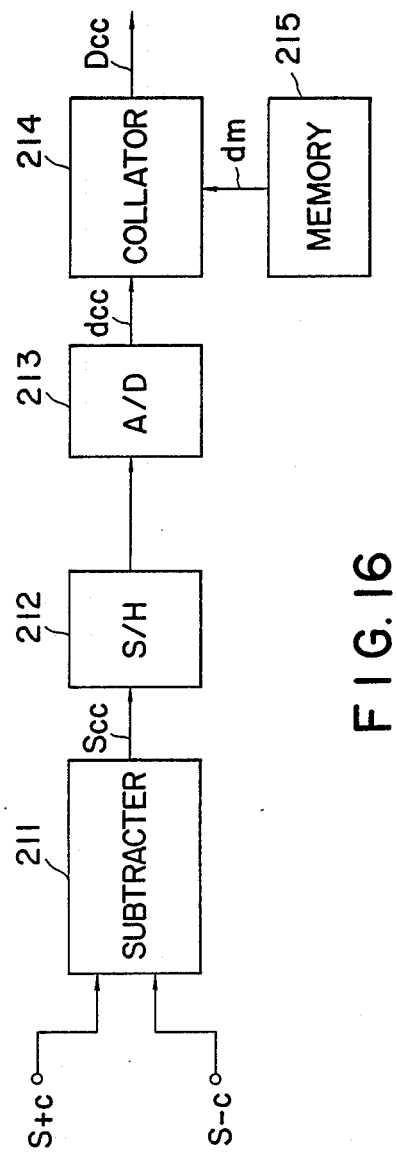
FIG. 16 is a block diagram showing an embodiment of a detection circuit thereof.

FIG. 16 is a block diagram to show an embodiment of a reader which obtains a positional data out of the electric signals from the above-mentioned light spot position detecting element 206. As mentioned above, positive and negative diffracted light beams of the same order are arbitrarily selected to attain the purpose. For instance, positions of the two light spots of the first-order diffracted light beams $LH\pm_1$ are converted into electric signals $S+c$ and $S-c$ by the light spot position detecting element 206 respectively. The electric signals $S\pm_c$ are converted into an electric signal $S_{cc}$ to express a distance between the first-order diffracted light beams $LH\pm_1$ by a subtracter 211, the electric signal $S_{cc}$ is converted into digital data $d_{cc}$ by a sample-and-hold circuit 212 and an A/D converter 213, and outputted to a collator 214. A memory 215 stores in advance the distances between the positive and negative first-order diffracted light beams corresponding to the grating track patterns, and the positional datas corresponding to the distances. The distance dm between each set of the diffracted light beams read out of the memory 215 is referred to the digitized distance $d_{cc}$ of the particular diffracted light set so as to output an appropriate positional data $D_{cc}$ on the scale.

Figure 17:
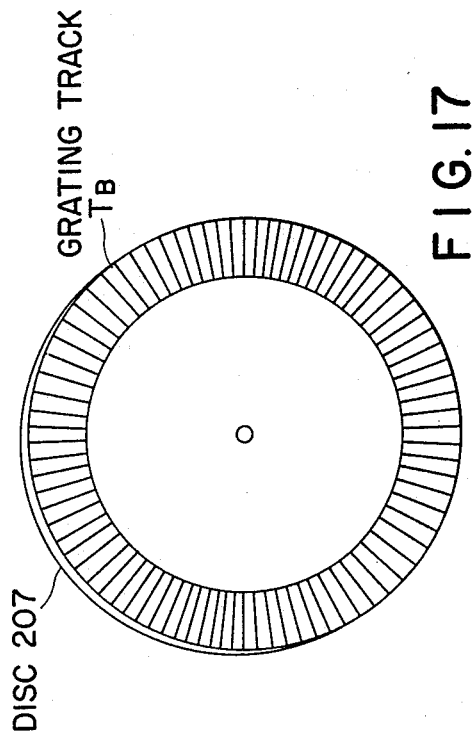
FIG. 17 is a perspective view showing another application of a grating track.

Although in the aforementioned second embodiment, the coherent light emitted from the luminous element is transmitted into the scale to obtain the diffracted light beams, it may be reflected from the scale to obtain the diffracted light beams because transmitted light and reflected light have the same properties. When the light is reflected, the luminous element, the collimating lens, the slit, the focusing lens and the light spot position detecting element are arranged on the same side as the scale, and the scale comprises sections which reflect light and sections which do not reflect light. If the scale is made into a disc 207 as shown in FIG. 17, the grating track $T_B$ is arranged annularly on the surface thereof and the disc 207 may be rotated around the center thereof, the angles can be detected in absolute fashion. Although in the aforementioned embodiment, the light source and the light spot position detecting element are fixed while the scale is moved for positional detection, the scale may be fixed while the light source and the light spot position detecting element are moved to achieve a similar effect in positional detection.

In the second embodiment, the grating track has the different pitches for the non-transmission sections and the transmission sections, but has the same ratios and grating line direction over the whole length. The positions are detected by the distances between the plural diffracted light beams having the same orders. The same effect can be achieved in positional detection by the third embodiment which will be described below.

Figure 18:
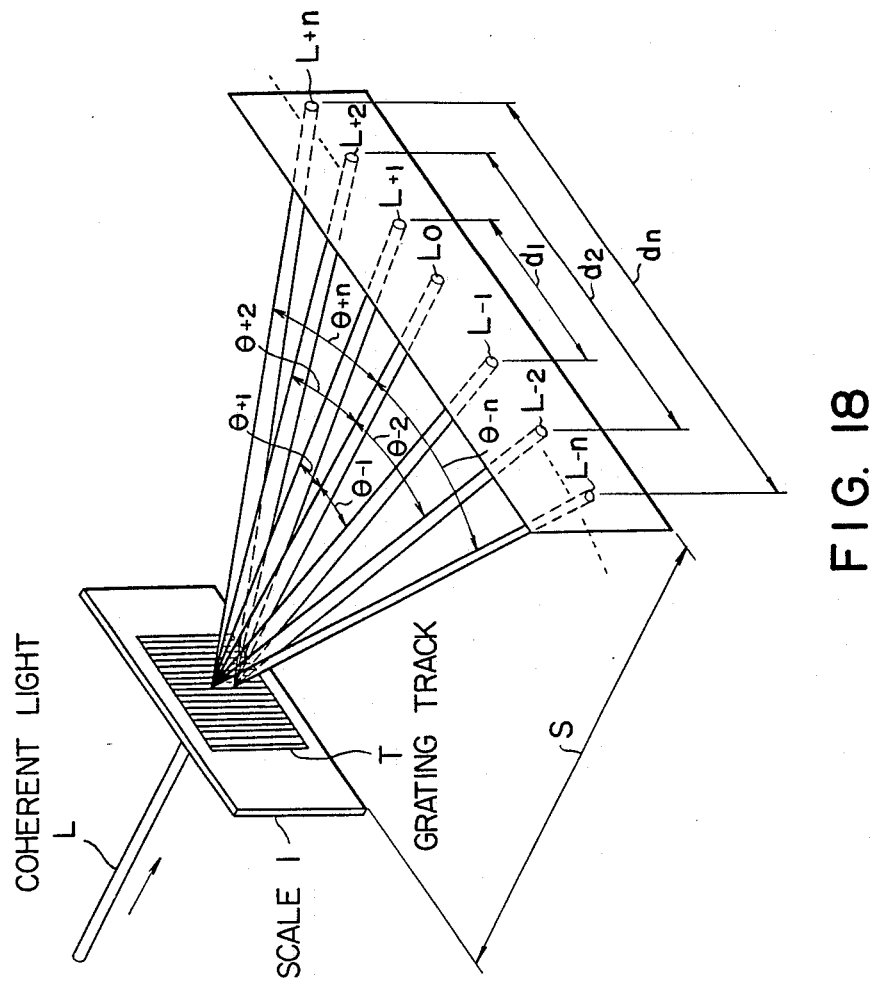
FIG. 18 is a view used to explain a third embodiment in accordance with the present invention.

As shown in FIG. 18, when coherent light L such as a laser beam is entered into a scale 1 on which surface is provided a grating track T having transmission sections and non-transmission sections alternating at a predetermined pitch, the coherent light L which has passed through the transmission sections is diffracted into plural diffracted light beams $L_o, L\pm_1, L\pm_2, \ldots, L\pm_n$ (hereinafter referred to as nth-order diffracted light beams (n is an integer). Angles $\pm\theta_n$ (referred to as the diffraction angles) formed by the positive and negative nth-order diffracted light beams $L_{+n}, L_{-n}$ and the coherent light L can be expressed by a following expression (5) using a wavelength $\lambda$ of the coherent light L a pitch P of the grating track T.

$$\pm\theta_n = \pm\sin^{-1}\left(\frac{n\lambda}{P}\right) \qquad (5)$$

Therefore, light spots of the positive and negative diffracted light beams $L_{+1}$ and $L_{-1}$ projected on a screen 2 placed apart from the scale 1 by a distance S are positioned on a line which is orthogonal to the grating line with a distance $d_n$. The distance $d_n$ is expressed by a expression (6) below.

$$d_n = 2S\tan\left\{\sin^{-1}\left(\frac{n\lambda}{P}\right)\right\} \qquad (6)$$

If the coherent light L is entered into a scale provided with a grating track having different grating line directions by locations, and light spots are obtained from arbitrarily chosen positive and negative diffracted light beams $L_{+n}$ and $L_{-n}$ of the same order, then positional detection on the scale can be made from the angle of movement (rotation) of the light spots.

The third embodiment of this invention will now be described.

Figure 19:
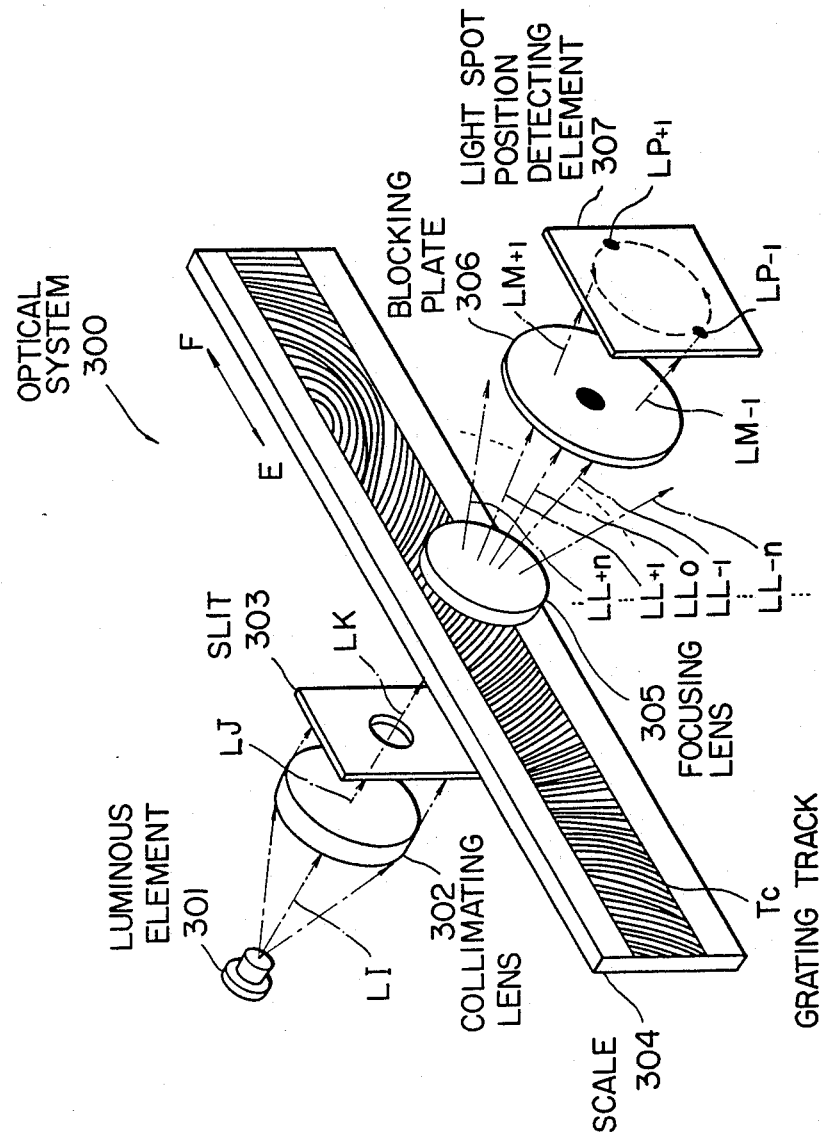
FIG. 19 is a perspective structural view showing an embodiment of an optical system thereof.

FIG. 19 is a structural view to show an embodiment of an optical system of an optical absolute encoder according to this invention which comprises a luminous element 301 such as LD (laser diode) which emits coherent light LI, a collimating lens 302 which collimates the coherent light LI 301 into parallel light LJ, a slit 303 which allows the parallel light LJ to partially pass therethrough to become a flux LK of light of a predetermined width, an elongated scale 304 having on the surface thereof a grating track Tc where sections which transmit the light flux LK and non-transmission sections are alternated at the same ratio and pitch but in different directions, a focusing lens 305 which focuses plural diffracted light beams (not shown) after diffraction by the grating track $T_c$, a blocking plate 308 which blocks only the 0th-order diffracted light beam $LL_0$ out of diffracted light beams $LL_0$, $LL\pm_1$, ... from the focusing lens 305, and a light spot position detecting element 307 such as an image sensor which detects positions of light spots $LP\pm_1$ of positive and negative diffracted light beams of the same order (the first-order diffracted light beams $LM\pm_1$ in the figure) which have passed through the blocking plate 306 and converts the positions of light spots into electric signals. The luminous element 301, the collimating lens 302, the slit 303, the focusing lens 305 and the blocking plate 306 are fixed in a linear arrangement and may be moved relative to the scale 304. In the figure, however, the scale 304 is adapted to move linearly in the longitudinal direction E or F.

As shown in FIGS. 20A-F, the scale 304 used in the optical system 300 of the absolute type optical encoder of the above structure is provided with the grating track $T_c$ having transmission sections and non-transmission sections of the same ratio and pitch but disposed in different directions at a distance $l_{AB}$ (more particularly, since the location of the detection moves as k→l→m→n in accordance with the movement of the grating track $T_c$, the direction of grating line rotates counterclockwise and returns at a point O to the same direction as the point k.) The light spots $LP_{+1}$ and $LP_{31\ 1}$ of incident first-order diffracted light beams $LM\pm_1$ on the detector 307 rotate (in FIG. 20, k'→l'→m'→n'→0') on the circumference of the diameter $d_1$ on the detector 307 constantly at an interval angle of 180° since the scale 304 moves in the longitudinal direction E or F. By using the rotation angle, the position on the scale 304 can be detected.

As stated above, since the direction of the grating line is used simply to rotate light spots, it is possible to change the direction of grating line in the distance $l_{AB}$ freely. The position on the scale can thus be detected by using such rotational angle of the light spots of any positive and negative diffracted light beams of the same order.

Figure 21:
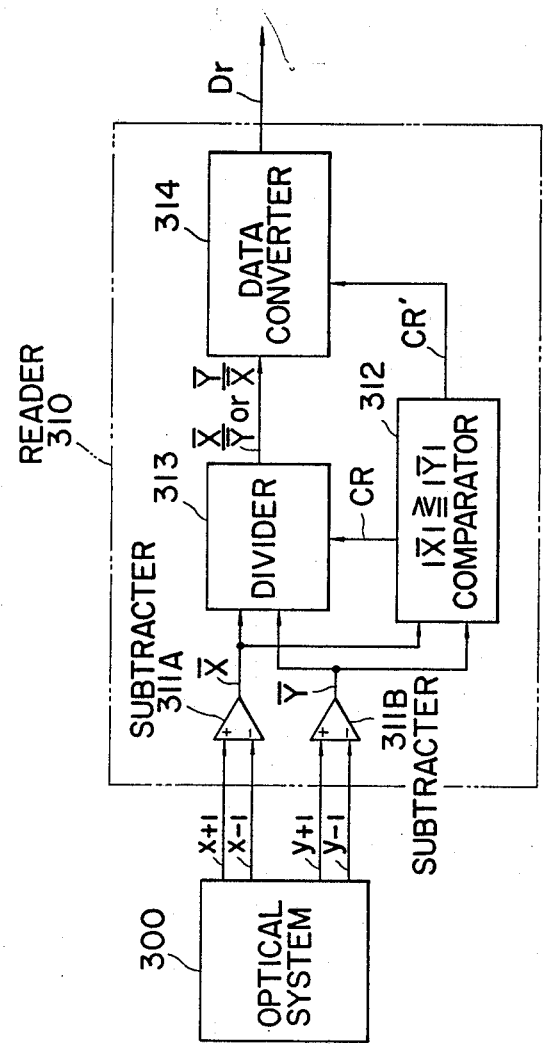
FIG. 21 is a block diagram showing an embodiment of a detection circuit thereof.
Figure 22:
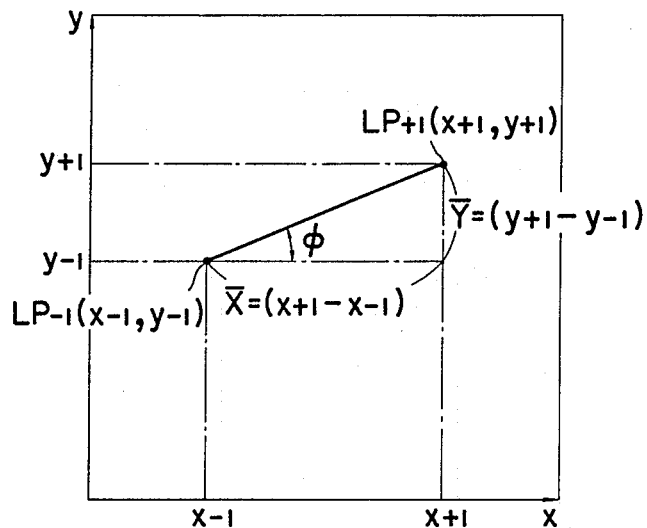

FIG. 21 is a block diagram to show an embodiment of a reader which obtains a positional data out of the electric signals from the light spot position detecting element 307. As mentioned above, positive and negative diffracted light beams of the same order are arbitrarily selected to attain the purpose. For instance, positions of the two light spots $LP_{+1}$, $LP_{-1}$ of the first-order diffracted light beams $LM\pm_1$ are converted by the light spot detecting element 307 into electric signals $(X_{+1}, Y_{+1})$ and $(X_{-1}, Y_{-1})$ which express coordinates (X, Y) as shown in FIG. 22. Subtracters 311A and 311B obtain $\overline{X}$ component $X=(X_{+1}-X_{-1})$ and Y component $\overline{Y}=(Y_{+1}-Y_{-1})$ between light spots to output the results to a comparator 312 and a divider 313. The comparator 312 compares the X component $\overline{X}$ and the Y component $\overline{Y}(|\overline{X}|\geq|\overline{Y}|$ or $|\overline{X}|<|\overline{Y}|)$, and outputs the result to the divider 313. When $|\overline{X}|\geq|\overline{Y}|$, the divider 313 calculates $\overline{Y}/\overline{X}$, and when $|\overline{X}|<|\overline{Y}|$, it calculates $\overline{X}/\overline{Y}$, and outputs the results to a data converter 314. FIGS. 23A-F show examples of the relationship between the dividend $\overline{Y}/\overline{X}$ or $\overline{X}/\overline{Y}$ and the position on the scale 304, the positions of the light spots on the detector 307 corresponding to the above, and the comparison result CR by the comparator 312. In this case, the scale 304 is provided with the grating track Tc wherein the position of the scale 304 is proportional to the changes of grating line direction. As the scale 304 changes its position, the dividend $\overline{Y}/\overline{X}$ within the scope of $|\overline{X}|\geq|\overline{Y}|$ defines a tangent curve while the dividend $\overline{X}/\overline{Y}$ within the scope of $|\overline{X}|\geq|\overline{Y}|$ defines a cotangent curve. The data converter 314 calculates $\tan^{-1}(\overline{Y}/\overline{X})$ when the result CR' from the comparator 312 is $|\overline{X}|\geq|\overline{Y}|$, and $\cot^{-1}(\overline{X}/\overline{y})$ when it is $|\overline{X}|\geq|\overline{Y}|$ in order to obtain gradient $\phi$ of the linear line connecting the spots $LP_{+1}$ and $LP_{-1}$, and outputs an appropriate positional data $D_p$ out of the data on the positions of the scale 304 which are stored in advance. Even if the scale 304 is provided with the grating track Tc where the position of the scale 304 is not proportional to the changes in grating line direction, the positional data $D_p$ can be obtained simply by storing in advance the positional data of the scale 304 which is corresponding to the dividend $\overline{Y}/\overline{X}$ or $\overline{X}/\overline{Y}$ in the converter 314.

Figure 24:
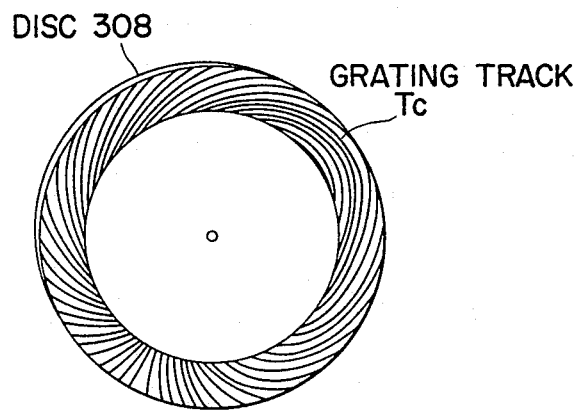
FIG. 24 is a perspective view showing another application of a grating track thereof.

Although in the aforementioned third embodiment, the coherent light emitted from the luminous element is transmitted into the scale to obtain the diffracted light beams, it may be reflected form the scale to obtain the diffracted light beams because transmitted light and reflected light have the same properties. When the light is reflected, the luminous element, the collimating lens, the slit, the focusing lens, blocking plate and the light spot position detecting element are arranged on the same side as the scale, and the scale comprises sections which reflect light and sections which do not reflect light. If the scale is made into a disc 308 as shown in FIG. 24, the grating track Tc is arranged annularly on the surface thereof and the disc 308 may be rotated around the center thereof, the angles can be detected in an absolute fashion. Although in the aforementioned embodiment, the light source and the light spot position detecting element are fixed while the scale is moved for positional detection, the scale may be fixed while the light source and the light spot position detecting element are moved to achieve a similar effect in positional detection.

As described in detail in the foregoing statement, this invention optical encoder enables detection of absolute position over long stroke simply with only one grating track instead of plural grating tracks of conventional encoders. This greatly contributes to minimize the size of an optical encoder and of its components as well as to reduce the manufacture cost and product cost of optical encoders.

Especially in the case of the first embodiment, the number of photo detectors can be reduced from a plurality in the prior art to only two to thereby drastically decrease the number of components and to further reduce the manufacture as well as the product costs.

It should be understood that many modifications and adaptations of the invention will become apparent to those skilled in the art and it is intended to encompass such obvious modifications and changes in the scope of the claims appended hereto.

What is claimed is:

1. An optical encoder comprising: a light source unit which emits coherent parallel light, a scale which is provided with a grating track of uniform ratio and pitch but of different grating line directions of non-transmission sections against transmission sections and which diffracts said coherent parallel light emitted form said light source unit, and a light spot position detecting unit which receives positive and negative diffracted light beams of the same order out of light beams diffracted by said scale, and which detects light spot positions of said respective positive and negative diffracted light beams of the same order and converts said detected light spot positions into electrical signals corresponding thereto.

2. The optical encoder as claimed in claim 1, wherein said light source unit comprises a light source which emits coherent light, a collimating lens which collimates said coherent light emitted from said light source into parallel light, and a slit which restricts said parallel light collimated by said collimating lens into a predetermined width.

3. The optical encoder as claimed in claim 2, wherein said light source is an element to oscillate laser beam.

4. The optical encoder as claimed in claim 1, wherein said light source unit and said light spot position detecting unit are arranged on opposite sides of said scale, and the transmission sections of said scale allow said parallel light emitted from said light source unit to pass therethrough for diffraction.

5. The optical encoder as claimed in claim 1, wherein said light source unit and said light spot position detecting unit are arranged on the same side as said scale, and the transmission sections of said scale reflect said parallel light emitted from said light source unit to be diffracted.

6. The optical encoder as claimed in claim 1, wherein a relative movement between said scale, and said light source unit and said light spot position detecting unit is enabled by the movement of said scale.

7. The optical encoder as claimed in claim 1, wherein the relative movement between said scale, and said light source unit and said light spot position detecting unit is enabled by the movement of said light source unit and said light spot position detecting unit.

8. The optical encoder as claimed in claim 1, wherein said scale is an elongated plate provided with a grating track, and said relative movement is linear.

9. The optical encoder as claimed in claim 1, wherein said scale is a disc provided with an annular grating track, and said relative movement is rotational.

10. The optical encoder as claimed in claim 1, wherein said light spot position detecting unit comprises a focusing lens which focuses the light beams diffracted by said scale, a blocking plate which blocks only diffracted light beams of 0th-order out of light beams focused by said focusing lens, and a light spot position detecting element which detects light spot positions of diffracted light beams which have passed through said blocking plate and converts said light spot positions into electrical signals.

11. The optical encoder as claimed in claim 10, wherein said light spot position detecting element is an image sensor which converts detected light spot positions into electrical signals.

12. An optical encoder comprising:

an optical system comprising a light source unit which emits coherent parallel light, a scale which is provided with a grating track of uniform ratio and pitch but of different grating line directions of non-transmission sections against transmission sections and which diffracts said parallel light emitted from said light source unit, and a light spot position detecting unit which receives positive and negative diffracted light beams of the same order out of light beams diffracted by the scale, and which detects positions of light spots of said respective positive and negative diffracted light beams of the same order and converts said detected light spot positions into electrical signals corresponding thereto; and a reader unit which obtains a rotation angle of the light spots of the positive diffracted light beams and the negative diffracted light beams of the same order out of the electrical signals outputted from said light spot position detecting unit which change along with the relative movement between said scale and said light source unit and said light spot position detecting unit, and converts said rotation angle into a positional data on said scale by a converting means.

13. The optical encoder as claimed in claim 12, wherein said reader unit comprises a subtracter which obtains a difference between electrical signals respectively corresponding to detected light spot positions of the positive diffracted light and the negative diffracted light of the same order on orthogonal coordinates outputted from said light spot position detecting unit in order to calculate respective orthogonal components of lines connecting said respective light spot positions, a comparator which compares said orthogonal components obtained by said subtracter, a divider which divides said orthogonal components from said subtracter by the result of the comparison from said comparator, and a converting means which converts the dividends from the divider into a positional data on said scale.

14. The optical encoder as claimed in claim 13, wherein said converting means comprises a memory which stores in advance rotation angles of the light spots of said positive diffracted light beams and negative diffracted light beams of the same order in correspondence with the patterns of said grating track which vary along with the relative movement between said scale and said light source unit and said light spot position detecting unit, and a collator which obtains said rotation angles form the dividends calculated by said divider, and which compares said rotation angles with the rotation angles stored in said memory, and outputs appropriate positional data on said scale.

15. The optical encoder as claimed in claim 13, wherein said converting means comprises a memory which stores in advance said dividends in correspondence with the patterns of said grating track which vary along with the relative movement between said scale and said light source unit and said light spot position detecting unit, and a collator which compares the dividends calculated by said divider with the dividends stored in said memory, and outputs appropriate positional data on said scale.

* * * * *